United States Patent
Ho et al.

(10) Patent No.: US 6,833,311 B2
(45) Date of Patent: Dec. 21, 2004

(54) MANUFACTURING METHOD FOR A SHALLOW TRENCH ISOLATION REGION WITH HIGH ASPECT RATIO

(75) Inventors: Hsin-Jung Ho, Taipei Hsien (TW); Chang Rong Wu, Taipei Hsien (TW); Tzu En Ho, Ilan Hsien (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/426,327

(22) Filed: Apr. 30, 2003

(65) Prior Publication Data

US 2004/0058507 A1 Mar. 25, 2004

(30) Foreign Application Priority Data

Sep. 25, 2002 (TW) ........................................ 91121991 A

(51) Int. Cl.[7] .............................................. H01L 21/76
(52) U.S. Cl. ...................... 438/424; 438/221; 438/435
(58) Field of Search .............................. 438/221, 424, 438/435, 437, 637, 685, 694, 689, 696, 758, 762, 243, 244, 248, 427

(56) References Cited

U.S. PATENT DOCUMENTS

| | | | | |
|---|---|---|---|---|
| 6,033,970 A | * | 3/2000 | Park ........................... | 438/435 |
| 6,096,233 A | * | 8/2000 | Taniyama et al. ............. | 216/92 |
| 6,153,543 A | * | 11/2000 | Chesire et al. ............... | 438/791 |
| 6,245,640 B1 | * | 6/2001 | Claussen et al. ............. | 438/424 |
| 6,274,933 B1 | * | 8/2001 | Abdelgadir et al. ......... | 257/758 |
| 6,331,472 B1 | * | 12/2001 | Liu et al. ..................... | 438/424 |
| 6,531,377 B2 | * | 3/2003 | Knorr et al. ................. | 438/435 |
| 6,541,401 B1 | * | 4/2003 | Herner et al. ................ | 438/787 |
| 6,551,900 B1 | * | 4/2003 | Chung et al. ................ | 438/424 |
| 6,573,152 B1 | * | 6/2003 | Fazio et al. .................. | 438/424 |
| 6,605,506 B2 | * | 8/2003 | Wu ............................ | 438/257 |
| 2002/0197836 A1 | * | 12/2002 | Iyer et al. .................... | 438/585 |
| 2003/0143852 A1 | * | 7/2003 | En-Ho et al. ................ | 438/694 |

* cited by examiner

*Primary Examiner*—Amir Zarabian
*Assistant Examiner*—Khanh Duong
(74) *Attorney, Agent, or Firm*—Quintero Law Office

(57) ABSTRACT

A manufacturing method for a shallow trench isolation region with high aspect ratio. The method comprises the steps of providing a substrate with a trench therein, forming a first insulation layer on the substrate and inside the trench by high density plasma chemical vapor deposition (HDPCVD), removing the majority of the first insulation layer outside the trench by spray type etching, and forming a second insulation layer on the first insulation layer by low pressure CVD to fill the trench. According to the present invention, a void-free shallow trench isolation with high aspect ration can be achieved.

26 Claims, 8 Drawing Sheets

MANUFACTURING METHOD FOR A SHALLOW TRENCH ISOLATION REGION WITH HIGH ASPECT RATIO

BACKGROUND OF THE INVENTION

1. Field of the Invention

The present invention relates to a manufacturing method for semiconductor integrated circuits. More particularly, the present invention relates to a manufacturing method for a shallow trench isolation region with high aspect ratio.

2. Description of the Related Arts

Recently, as the manufacturing techniques for semiconductor integrated circuits develop, the number of elements in a chip increases. The size of the element decreases as the degree of integration increases. The line width used in manufacturing lines has decreased from sub-micron to quarter-micron, or even smaller. However, regardless of the reduction in size of the element, adequate insulation or isolation must be formed among individual elements in the chip so that adequate element characteristics can be achieved. This technique is called device isolation technology. The main object is to form an isolation region, and reduce the size of the isolation as much as possible while assuring good isolation to have more chip space for more elements.

Among different element isolation techniques, LOCOS and shallow trench isolation region manufacturing methods are the most commonly used. In particular, as the latter has a small isolation region and can keep the substrate level after the process, it is the semiconductor manufacturing method receiving the most attention. The conventional manufacturing method for a shallow trench isolation region comprises forming a dielectric layer to fill a trench on a substrate by chemical vapor deposition (CVD), and etching back the dielectric layer on the substrate to remove the redundant dielectric layer. However, as the density of the semiconductor integrated circuits increases and the size of the elements decreases, the above mentioned deposition experiences problems in step coverage and cannot completely fill the trench. This influences the isolation effect among elements.

High density plasma chemical vapor deposition (HDPCVD) has extremely good gap-filling ability and is suitable for fine shallow trench isolation region manufacturing. However, the oxide layer deposited by HDPCVD has a distinctive topography which has to be leveled by chemical mechanical polishing (CMP).

At present, the manufacturing method for a shallow trench isolation region usually utilizes HDPCVD for better step coverage in the trench. To further illustrate the process, the manufacturing method is shown in cross section in FIGS. 1A to 1B.

As shown in FIG. 1A, a shield layer is formed on a substrate 10. For example, a pad oxide layer 11 with a thickness of 50 Å to 200 Å is formed on a silicon substrate 10 by chemical vapor deposition (CVD) or thermal oxidation, and a silicon nitride layer 12 with a thickness of 1,200 Å to 1,700 Å is deposited on the pad oxide layer 11 by CVD. The pad oxide layer 11 and the silicon nitride layer 12 both form the shield layer. Next, a photoresist layer is coated on the silicon nitride layer 12 and patterned using photolithography to expose the portion where the element isolation region is to be formed. The silicon nitride layer 12 and the pad oxide layer 11 are etched sequentially using the photoresist layer as a mask. After the photoresist layer is removed with adequate liquid, the silicon nitride layer 12 and the pad oxide layer 11 are used as a mask to etch silicon substrate 10, and a trench with a depth of 5000 Å to 6000 Å is formed for the isolation of elements.

Next, as shown in FIG. 1B thermal oxidation is performed to grow a thin oxide layer 14 with a thickness of 180Å~220 Å as a liner covering the bottom and sidewall of the trench. A thin silicon nitride layer 16 is then formed on the shield layer. After that, HDPCVD is performed, using, for example. O2 and SiH4 as reactants with Ar sputtering to deposit a silicon dioxide layer 18 as an insulation layer, and the trench Is filled as shown in FIG. 1B. The silicon dioxide layer 18 has an undulate surface due to different densities of trench distribution and the characteristics of HDPCVD.

The manufacturing method for a high aspect ratio shallow trench isolation region presently has the drawback as shown in FIGS. 1C and 1D.

As shown in FIG. 1C, as the opening width of the trench narrows and/or the aspect ratio of the trench increases, for example the opening width may be less than 0.15 $\mu$m and/or the aspect ratio larger than 3, the silicon dioxide layer 18 deposited conventionally, using HDPCVD, may have voids 20 which result in poor insulation quality of the shallow trench isolation region.

In addition, as shown in FIG. 1D, debris 21 produced during Ar sputtering in HDPCVD may remain inside the trench, and this also results in void formation.

SUMMARY OF THE INVENTION

It is thus a primary object of the present invention to provide a manufacturing method for a shallow trench isolation region to improve the gap-filling ability of the insulation layer and isolation quality among elements.

In one aspect of the present invention, the manufacturing method for a shallow trench isolation region comprises providing a substrate with a trench therein, forming a first insulation layer on the substrate and inside the trench by high density plasma chemical vapor deposition (HDPCVD), removing the majority of the first insulation layer outside the trench, and forming a second insulation layer on the first insulation layer by low pressure chemical vapor deposition (LPCVD) to fill the trench. With the manufacturing method for the present invention, a void-free shallow trench isolation region can be accomplished.

In another aspect of the present invention, the manufacturing method for a shallow trench isolation region comprises providing a substrate with a trench therein, forming a first insulation layer on the substrate and inside the trench by HDPCVD, removing the majority of the first insulation layer outside the trench, forming a second insulation layer on the first insulation layer and inside the trench by HDPCVD, removing the majority of the second insulation layer outside the trench, and forming a third insulation layer on the second insulation layer by LPCVD to fill the trench. With repeated steps of high density plasma chemical vapor deposition and etching, a trench with high aspect ratio, for example, with an aspect ratio larger than 3.5 or 4, or even 9 to 10, can be filled. After removing the insulation layer outside the trench, the trench is filled by LPCVD to prevent unwanted void formation in the shallow trench isolation region.

According to a preferred embodiment of the present invention, the first insulation layer is formed by HDPCVD using $O_2$ and $SiH_4$ as reactants with Ar sputtering. The insulation layer outside and on the sidewalls of the trench is spray-etched using a mix of HF and sulfuric acid as echant with a spray type oxide etchant for the subsequent LPCVD. The reactant for the final LPCVD is tetraethyloxysilane (TEOS).

BRIEF DESCRIPTION OF THE DRAWINGS

The present invention will be more fully understood and further advantages will become apparent when reference is made to the following description of the invention and the accompanying drawings in which:

FIGS. 1A and 1B show the manufacturing method for a shallow trench isolation region using HDPCVD; FIGS. 1C and 1D show the drawbacks of the prior art;

FIG. 3A shows a cross section before deposition, FIG. 3B shows a cross section after repeated steps of HDCVD and etching, and FIG. 3C shows a cross section after LPCVD.

DETAILED DESCRIPTION OF THE INVENTION

Without intending to limit it in any manner, the present invention will be further illustrated by the following description.

Figure 1A:
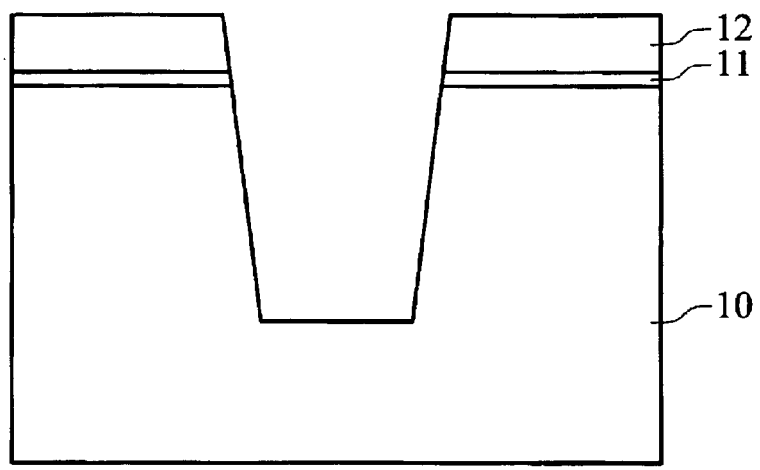
FIGS. 1A~1D are cross sections of the prior art.
Figure 1B:
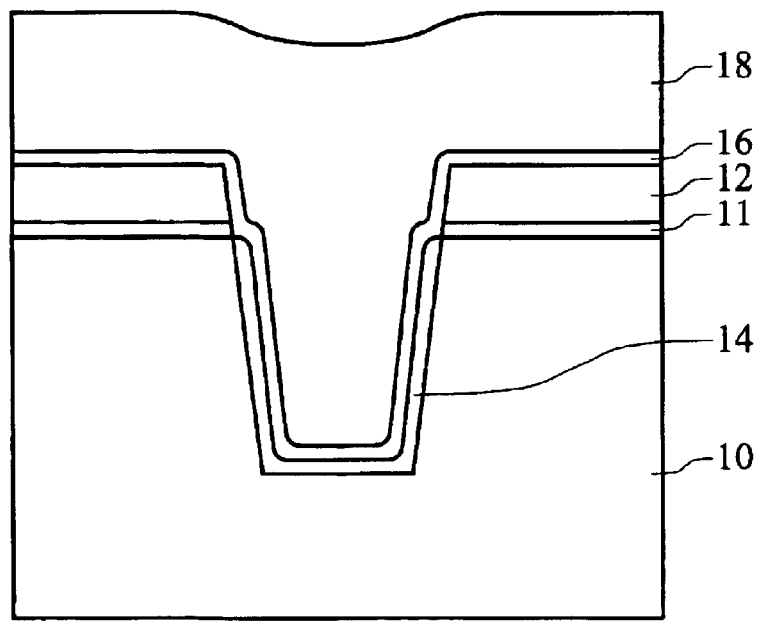
Figure 1C:
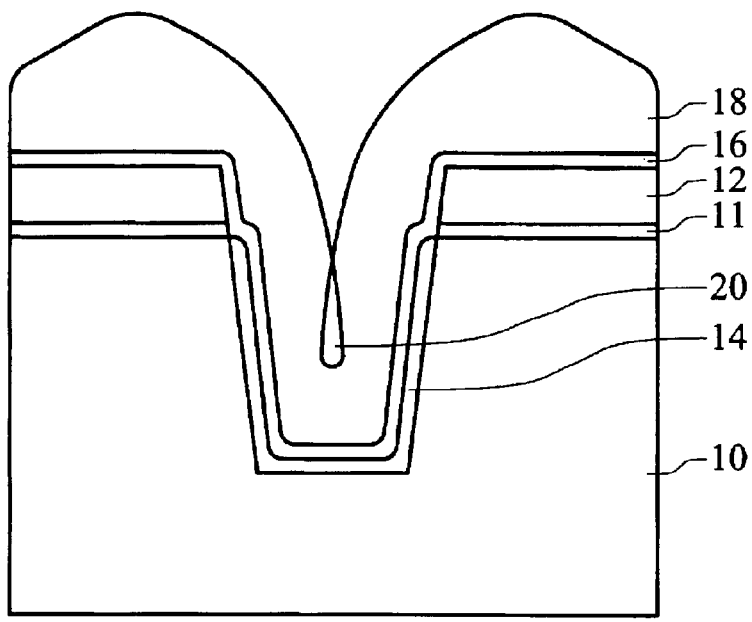
Figure 1D:
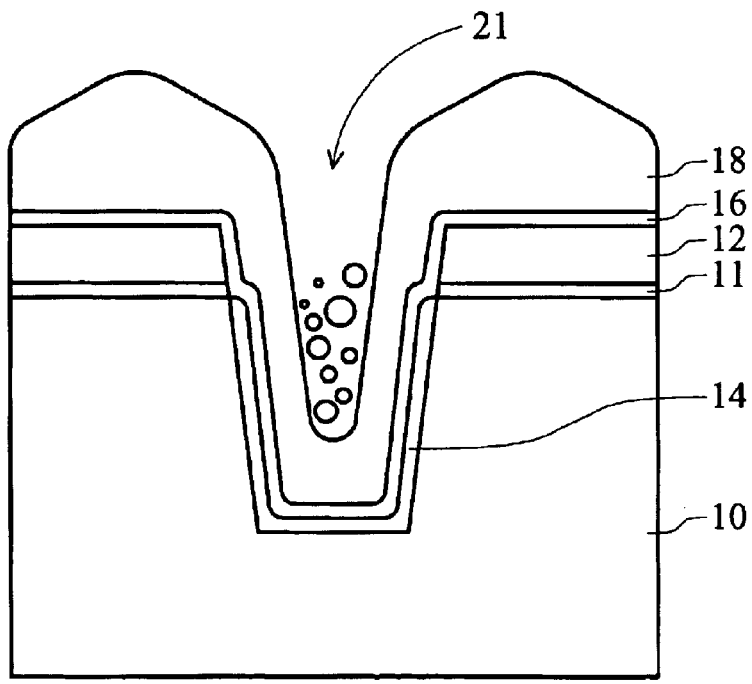
Figure 2A:
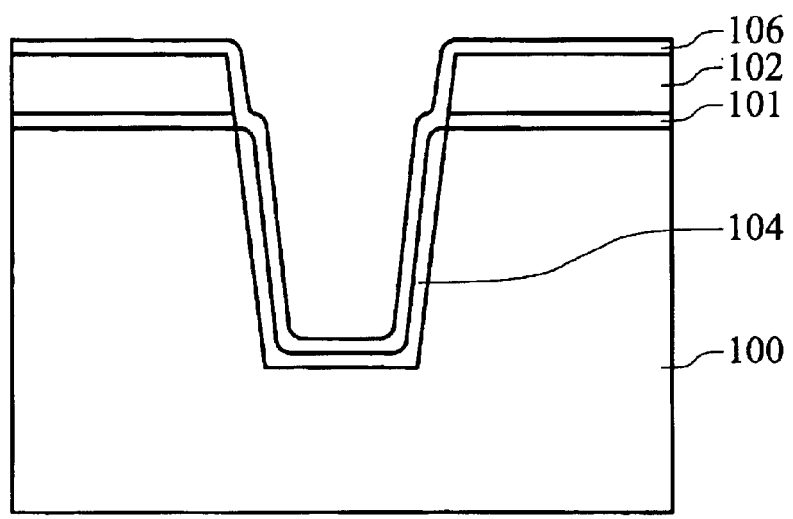
FIGS. 2A~2G are a series of cross sections showing a preferred embodiment of the present invention.

As shown in FIG. 2A, a pad oxide 101 with a thickness of 50 Å to 200 Å is formed on a silicon substrate 100 by CVD or thermal oxidation. A silicon nitride layer 102 with a thickness of 500 Å to 2000 Å is then deposited on the pad oxide layer 101 by CVD. The pad oxide 101 and the silicon nitride layer 102 together form a shield layer. Next, a photoresist layer is coated on the silicon nitride layer 102 and patterned using photolithography to expose the portion where the element isolation region is to be formed. The silicon nitride layer 102 and the pad oxide layer 101 are etched sequentially using the photoresist layer as a mask. After the photoresist layer is removed with adequate liquid, the silicon nitride layer 102 and the pad oxide layer 101 are used as a mask to etch silicon substrate 100, and a trench with a depth of 5000 Å to 10000 Å, preferably, 7000 Å, and a width of 700 Å to 1,500 Å, preferably, 1,000 Å, is formed for the element isolation. After that, thermal oxidation is performed to grow a thin oxide layer 104 with a thickness of 180Å~220 Å as a liner covering the bottom and sidewall of the trench. A thin silicon nitride layer 106 is then formed on the shield layer and also functions as a liner.

Figure 2B:
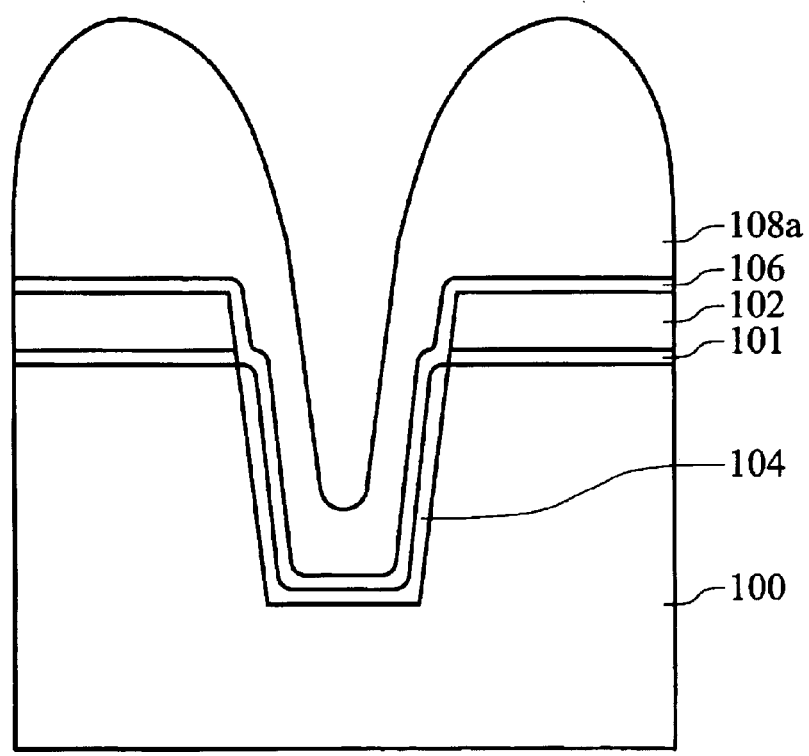

Next, as shown in FIG. 2B, a first high density plasma chemical vapor deposition of the present invention is performed. A first insulation layer 108a, such as a silicon dioxide layer, with a thickness of 2000Å~5000 Å, preferably 3000 Å, is formed on the thin silicon nitride 106 by HDPCVD using $O_2$ and $SiH_4$ as reactants with Ar sputtering. The high density plasma chemical vapor deposition results in a sloped sidewall in the trench.

Figure 2C:
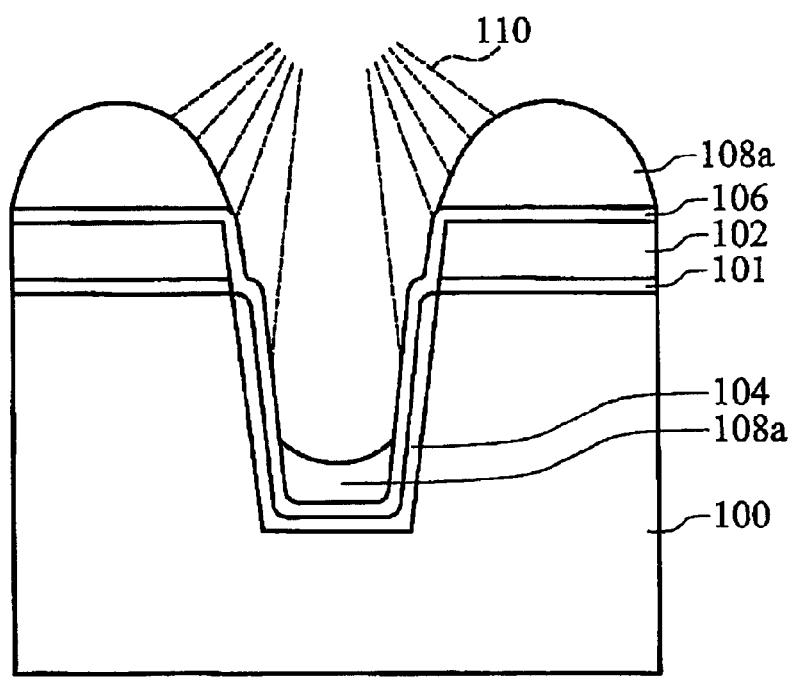

After that, as shown in FIG. 2C, the redundant deposit on the shield layer and the sidewall of the trench is removed by wet etching 100 using a mixture of HF and sulfuric acid as echant with a spray type oxide etchant, such as SEZ etchant.

Figure 2D:
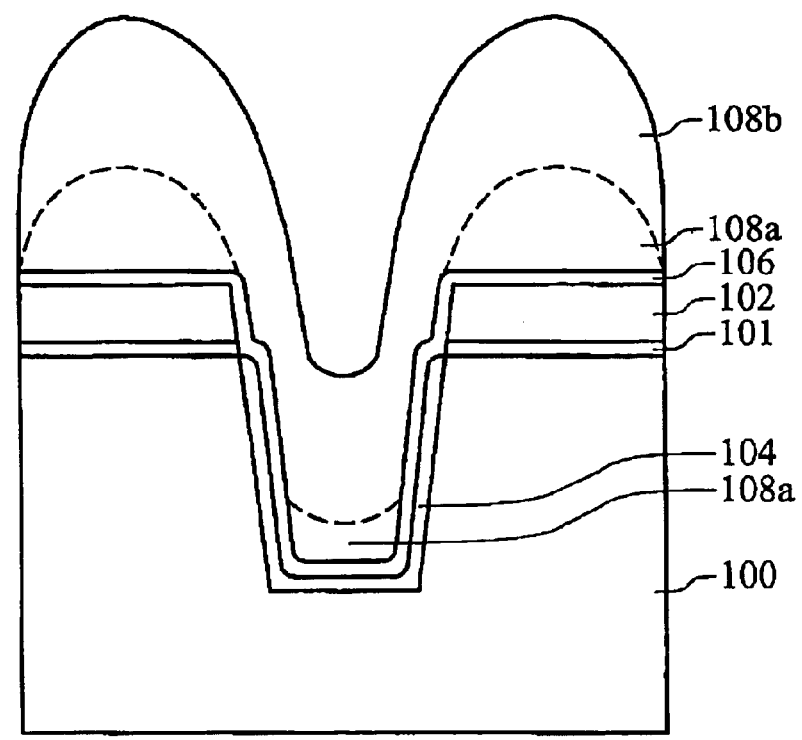

Next, as shown in FIG. 2D, a second high density plasma chemical vapor deposition is performed to form a second insulation layer 108b on the first insulation layer 108a. The second insulation layer 108b is a silicon dioxide layer with a thickness of 2000Å~5000 Å, preferably 3000 Å. The high density plasma chemical vapor deposition results in a sloped sidewall in the trench as well.

Figure 2E:
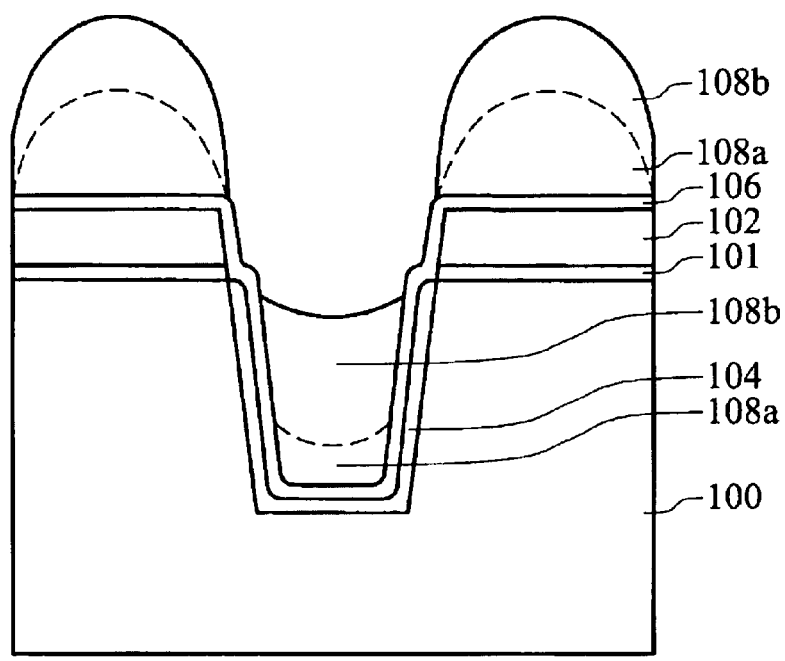

Afterwards, as shown in FIG. 2E, the redundant deposit on the shield layer and the sidewall of the trench is removed by wet etching using a mixture of HF and sulfuric acid as echant with a spray type oxide etchant, such as SEZ etchant.

Figure 2F:
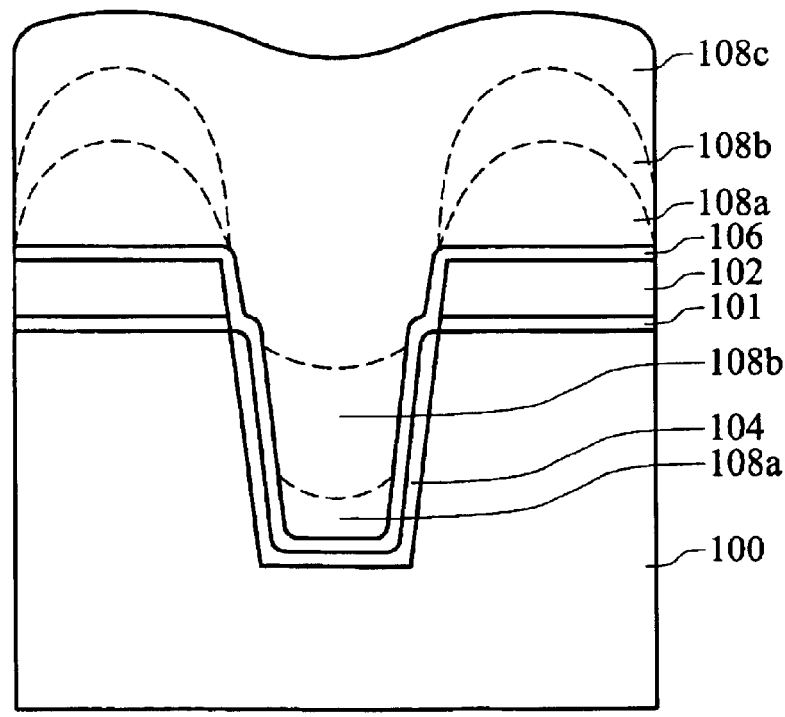

Next, as shown in FIG. 2F, a low pressure chemical vapor deposition is performed using tetraethyloxysilane (TEOS) as reactant to form a third insulation layer 108c on the second insulation layer 108b. The third insulation layer 108c is a silicon dioxide layer with a thickness of 5000Å~10000 Å, preferably 8000 Å. The first, the second, and the third insulation layers (108a, 108b, and 108c) together form an insulation layer 108. Thus, void formation in the trench can be prevented.

Figure 2G:
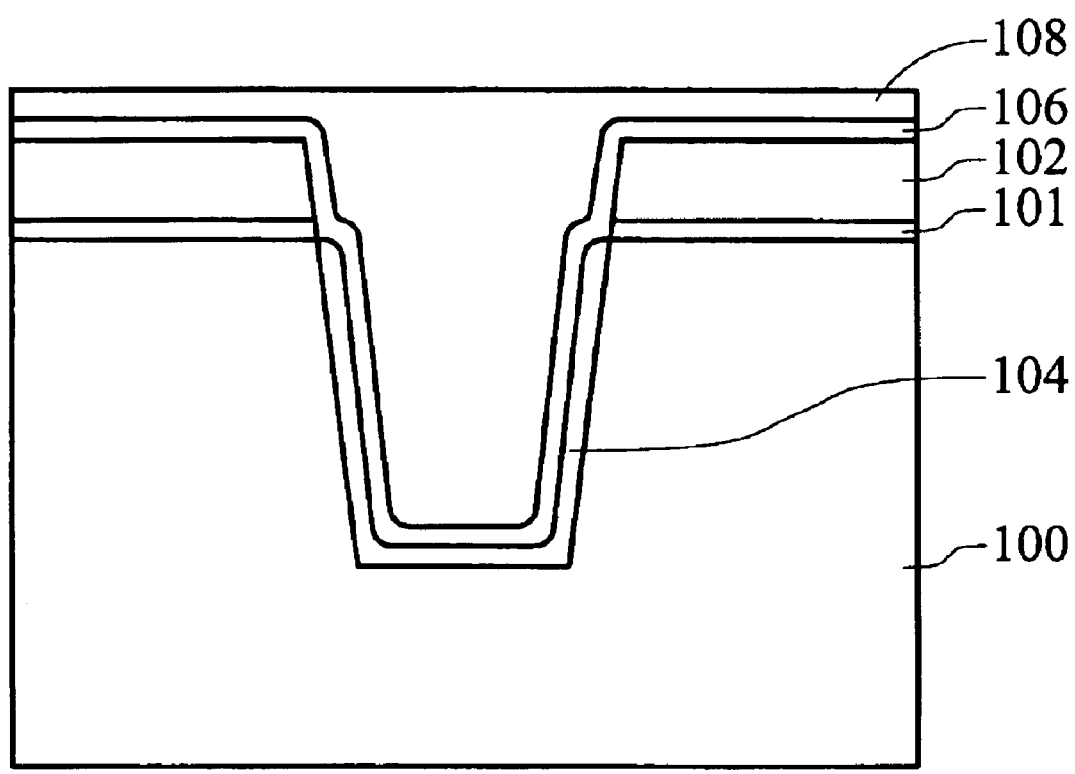

Finally, as shown in FIG. 2G, chemical mechanical polishing removes uneven insulation layer, including the first, the second, and the third insulation layers (108a, 108b, and 108c), covering the silicon nitride layer 106 and leaving the insulation layer inside the trench. The silicon nitride layer 102 and the pad oxide layer 101 are then removed using adequate liquid or etching to expose the element region. Accordingly, the shallow trench isolation region of the present invention is achieved.

Figure 3A:
FIGS. 3A~3C are scanned electron microscopic photographs showing practical results.
Figure 3B:
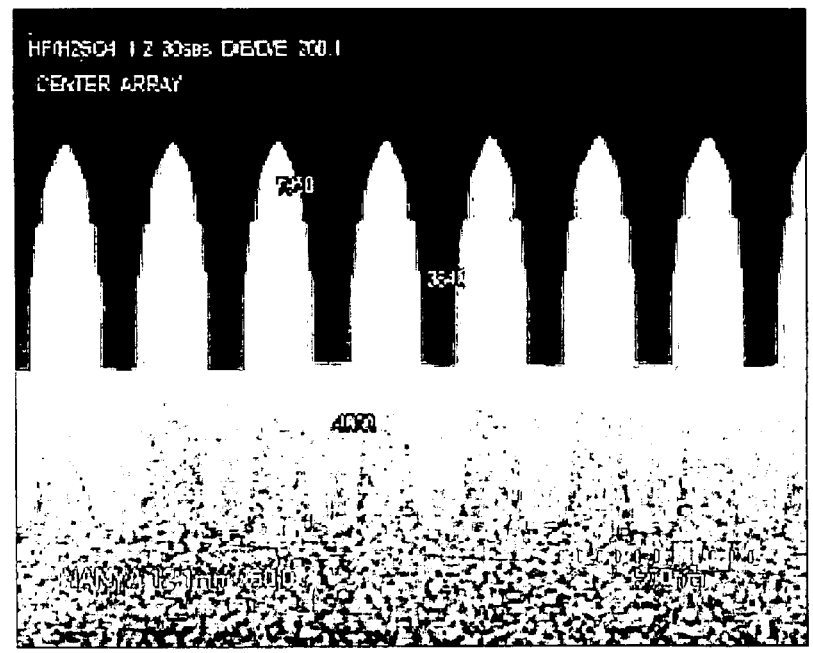
Figure 3C:

The practical results are shown in FIGS. 3A~3C. As shown in FIG. 3A, the aspect ratio of the trench is about 9~10 before deposition. After repeated steps of HDCVD and etching, as shown in FIG. 3B, the opening is suitable for the subsequent LPCVD. As shown in FIG. 3C, no void is observed in the trench after LPCVD.

Compared to the prior art, the manufacturing method for a shallow trench isolation region in the present invention has several advantages. First, the present invention prevents void formation in the high aspect ratio shallow trench isolation region. Second, the manufacturing method for the present invention has only five steps: repeated steps of high density plasma chemical vapor deposition and spray-etching to fill the trench partly which reduces the aspect ratio of the partly filled trench, and low pressure chemical vapor deposition to fill the trench eventually. The five steps of the present invention not only prevent void formation of the trench, but are also suitable for trenches with aspect ratio over 9~10. The conventional method using HDPCVD usually needs 7 or 9 steps to accomplish this task. Thus, the present invention simplifies the process. If the trench has a tapered profile, the process can be achieved in three steps, one HDCVD, one spray-etching, and one LPCVD. Accordingly, the present invention obtains a shallow trench isolation region having high aspect ratio without voids, resulting in increased quality.

While the invention has been particularly shown and described with the reference to the preferred embodiments thereof, it will be understood by those skilled in the art that various changes in form and details may be made without departing from the spirit and scope of the invention.

What is claimed is:

1. A manufacturing method for a shallow trench isolation region, comprising:

(a) providing a substrate with a trench therein;

(b) forming a first insulation layer on the substrate and Inside the trench by high density plasma chemical vapor deposition (HDPCVD);

(c) removing the majority of the first insulation layer outside the trench by spray-etching; and (d) forming a second insulation layer on the first insulation layer by low pressure chemical vapor deposition (LPCVD) to fill the trench.

2. The method as claimed in claim 1, wherein step(a) further comprises a step of:

providing the substrate with a shield layer thereon;

defining a pattern on the shield layer;

forming the trench on the substrate by etching using the pattern as a mask to expose the substrate;

forming a thin oxide layer on the bottom and sidewall of the trench by thermal oxidation; and forming a thin silicon nitride layer on the shield layer and the thin oxide layer.

3. The method as claimed in claim 2, wherein the shield layer comprises an oxide layer under a silicon nitride layer.

4. The method as claimed in claim 1, wherein the aspect ratio of the trench exceeds 3.

5. The method as claimed in claim 1, wherein the first insulation layer is a silicon dioxide layer.

6. The method as claimed in claim 5, wherein the thickness of the first insulation layer is 2000~5000Å.

7. The method as claimed in claim 1, wherein step (c) is performed using a mixture of HF and sulfuric acid.

8. The method as claimed in claim 7, wherein step (c) is performed by a spray type oxide etchant.

9. The method as claimed in claim 1, wherein the LPCVD of step (d) is performed using tetraethyloxysilene (TEOS) as reactant.

10. The method as claimed in claim 1, wherein the second Insulation layer is a silicon dioxide layer.

11. The method as claimed in claim 10, wherein the thickness of the second insulation layer is 5000~10000Å.

12. The method as claimed in claim 1, further comprising a step of leveling the second insulation layer and the shield layer after step (d).

13. The method as claimed in claim 12, wherein the leveling is performed by chemical mechanical polishing (CMP).

14. A manufacturing method for a shallow trench isolation region, comprising:

(a) providing a substrate with a trench therein;

(b) forming a first insulation layer on the substrate and inside the trench by high density plasma chemical vapor deposition {HDPCVD};

(c) removing the majority of the first insulation layer outside the trench;

(d) repeating steps (b) and (c) to form a second insulation layer filling the trench; and (e) forming a third insulation layer on the second insulation layer by low pressure chemical vapor deposition (LPCVD) to fill the trench.

15. The method as claimed in claim 14, wherein step(a) further comprises a step of:

providing the substrate with a shield layer thereon;

defining a pattern on the shield layer;

forming the trench on the substrate by etching using the pattern as a mask to expose the substrate;

forming a thin oxide layer on the bottom and sidewall of the trench by thermal oxidation; and forming a thin silicon nitride layer on the shield layer and the thin oxide layer.

16. The method as claimed in claim 15, wherein the shield layer comprises an oxide layer under a silicon nitride layer.

17. The method as claimed in claim 14, wherein the aspect ratio of the trench exceeds 3.

18. The method as claimed in claim 14, wherein the first and the second insulation layers are silicon dioxide layers.

19. The method as claimed in claim 18, wherein the thickness of the first or the second insulation layers is 2000~5000Å.

20. The method as claimed in claim 14, wherein step (c) is performed using a mixture of HF and sulfuric acid.

21. The method as claimed in claim 20, wherein step (c) is performed by a spray type oxide etchant.

22. The method as claimed in claim 14, wherein the LPCVD of step (e) is performed using tetrasthyloxysllane (TEOS) as reactants.

23. The method as claimed in claim 14, wherein the third insulation layer is a silicon dioxide layer.

24. The method as claimed in claim 23, wherein the thickness of the third insulation layer is 2000~5000Å.

25. The method as claimed in claim 14, further comprising a step of leveling the insulation layer and the shield layer after step(e).

26. The method as claimed in claim 25, wherein the leveling is performed by chemical mechanical polishing (CMP).

* * * * *